United States Patent
Linares (10) Patent No.: US 11,032,937 B2
(45) Date of Patent: Jun. 8, 2021

(54) AIR VENTILATION DEVICE INSIDE AN ENCLOSURE INTENDED TO HOUSE MODULAR ELECTRICAL UNITS, AND ENCLOSURE COMPRISING SUCH A DEVICE

(71) Applicant: Schneider Electric Industries SAS, Rueil Malmaison (FR)

(72) Inventor: Louis Linares, La Terrasse (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 15/784,315

(22) Filed: Oct. 16, 2017

(65) Prior Publication Data

US 2018/0168068 A1    Jun. 14, 2018

(30) Foreign Application Priority Data

Dec. 8, 2016    (FR) ...................... 16 62153

(51) Int. Cl.
| | |
|---|---|
| *H05K 7/20* | (2006.01) |
| *H02B 1/052* | (2006.01) |
| *H02B 1/56* | (2006.01) |
| *H05K 7/18* | (2006.01) |

(52) U.S. Cl.
CPC ......... *H05K 7/20172* (2013.01); *H02B 1/052* (2013.01); *H02B 1/56* (2013.01); *H02B 1/565* (2013.01); *H05K 7/183* (2013.01); *H05K 7/20181* (2013.01); *H05K 7/20209* (2013.01)

(58) Field of Classification Search
CPC ............... H05K 7/20172; H05K 7/183; H05K 7/20181; H05K 7/20209; H02B 1/052; H02B 1/56; H02B 1/565; F24F 13/14; F24F 13/10; F24F 13/08; F24F 13/081; F24F 7/013; F24F 13/06; F24F 13/18
USPC .................................................. 165/80.2, 47
See application file for complete search history.

(56) References Cited

U.S. PATENT DOCUMENTS

| | | | | |
|---|---|---|---|---|
| 3,099,949 | A | * | 8/1963 | Davidson ............... F24F 13/065 454/304 |
| 3,387,550 | A | * | 6/1968 | Thomson ............... F24F 13/065 454/286 |
| 3,824,910 | A | * | 7/1974 | Temming ............... B60H 1/345 454/154 |

(Continued)

FOREIGN PATENT DOCUMENTS

| | | |
|---|---|---|
| DE | 10 2004 008 513 A1 | 7/2005 |
| DE | 10 2014 104 857 A1 | 10/2015 |

(Continued)

OTHER PUBLICATIONS

French Preliminary Search Report dated Mar. 15, 2017 in French Application 16 62153, filed on Dec. 8, 2016 (with English Translation of Categories of cited documents).

*Primary Examiner* — Tho V Duong
*Assistant Examiner* — Reheena R Malik
(74) *Attorney, Agent, or Firm* — Oblon, McClelland, Maier & Neustadt, L.L.P.

(57) ABSTRACT

A ventilation device of the air inside an enclosure intended to house modular electrical units mounted on a mounting support. The device includes at least one fan in the form of a module that can be fixed on to the mounting support alongside the other units.

12 Claims, 6 Drawing Sheets

(56) References Cited

U.S. PATENT DOCUMENTS

| | | | |
|---|---|---|---|
| 6,341,064 B1 * | 1/2002 | Bradley | H02B 1/565 361/695 |
| 6,494,779 B1 | 12/2002 | Nicolai et al. | |
| 6,715,539 B2 * | 4/2004 | Bianco | F25D 17/067 165/122 |
| 8,144,464 B2 * | 3/2012 | VanDerVeen | H05K 7/20736 165/104.34 |
| 8,540,557 B1 * | 9/2013 | Derks | F24F 13/24 454/184 |
| 9,453,963 B2 * | 9/2016 | Sato | G02B 6/241 |
| 2004/0007347 A1 * | 1/2004 | Stoller | H05K 7/206 165/47 |
| 2004/0007348 A1 * | 1/2004 | Stoller | H02B 1/565 165/47 |
| 2010/0003126 A1 * | 1/2010 | Wang | F04D 25/0613 415/146 |
| 2011/0259550 A1 * | 10/2011 | Komaba | F16K 1/222 165/96 |
| 2013/0323044 A1 * | 12/2013 | Sun | H05K 7/20172 415/213.1 |
| 2014/0206276 A1 * | 7/2014 | Zhong | F24F 13/24 454/317 |
| 2014/0246169 A1 * | 9/2014 | Perrin | H05K 7/2089 165/47 |
| 2015/0167691 A1 * | 6/2015 | Chen | H05K 7/20172 415/108 |
| 2016/0165750 A1 * | 6/2016 | Tang | H05K 7/20181 361/692 |
| 2016/0227670 A1 * | 8/2016 | Liu | H05K 7/20181 |
| 2017/0341763 A1 * | 11/2017 | Bidault | B64D 13/06 |
| 2018/0376614 A1 * | 12/2018 | Xiong | H05K 7/20145 |

FOREIGN PATENT DOCUMENTS

| | | | |
|---|---|---|---|
| EP | 1 053 581 | 11/2000 | |
| WO | WO-2015150397 A1 * | 10/2015 | H05K 7/20145 |

* cited by examiner

AIR VENTILATION DEVICE INSIDE AN ENCLOSURE INTENDED TO HOUSE MODULAR ELECTRICAL UNITS, AND ENCLOSURE COMPRISING SUCH A DEVICE

TECHNICAL FIELD

The present invention relates to an air ventilation device inside an enclosure intended to house modular electrical units mounted on a mounting support and an enclosure comprising such a device.

PRIOR ART

The issue of hot air stagnation in electrical switchgear enclosures can result in the normative standards not being observed, in the ageing of the units being accelerated, and in having to downgrade the units.

In order to mitigate this drawback, there is a solution consisting in installing fans in the enclosures, these fans being generally secured to the enclosures. This solution is complicated and little used, mainly on the large models.

The patent EP1053581 is known, describing an electrical cabinet comprising a ventilation device, this device comprising a certain number of fans fixed onto the inner face of one of the walls of the enclosure. A non-standard cut has to be made to install such fans. Also, it is not possible to place these fans alongside a heat source on a DIN rail.

The present invention resolves these problems and proposes a ventilation device of simple design that can be placed alongside a heat source on a DIN rail, and that does not require the wall of the enclosure to be modified for it to be installed.

SUMMARY OF THE INVENTION

To this end, the subject of the present invention is an air ventilation device inside an enclosure intended to house modular electrical units mounted on a mounting support, this device being characterized in that it comprises at least one fan in the form of a module that can be fixed onto said mounting support alongside the other units.

According to a particular embodiment, the or each fan comprises means for creating a stirring of air inside the enclosure.

According to another embodiment, the or each fan comprises means for discharging the hot air present inside the enclosure to the outside of the enclosure through an outlet opening provided in the casing of the fan, said outlet opening communicating with an opening provided in a wall of the enclosure.

According to a particular feature, the or each abovementioned fan comprises a means for shutting or freeing the abovementioned outlet opening of the fan according to the mode of use chosen for this ventilation device.

According to another feature, this means is a shutter articulated on an internal part of the casing of the fan.

According to another feature, this ventilation device comprises at least one thermal sensor, and means for automatically triggering the abovementioned ventilation device controlled by said thermal sensor.

According to another feature, this device comprises at least one humidity sensor, and heating means controlled by said humidity sensor.

According to another feature, the abovementioned heating means comprise a heating resistor.

Another subject of the present invention is an enclosure intended to house modular electrical units, these modular electrical units being mounted on a mounting support, this enclosure being characterized in that it comprises a ventilation device comprising the features mentioned previously taken alone or in combination.

According to a particular feature, the abovementioned ventilation device is attached to one of the faces of a modular unit belonging to a row of units mounted on one and the same mounting support.

According to another feature, a wall of said enclosure comprising, facing one or each mounting support intended to receive a row of units, an elongate opening intended to allow the passage of a nose-forming part of the units, this part comprising the manual operating lever of the units, this enclosure is characterized in that the abovementioned ventilation device has substantially the same outer form as a modular electrical unit, and also comprising a nose-forming part that can pass through the abovementioned opening of the enclosure so as to allow the discharging of the hot air through this opening of the enclosure via an outlet opening of the fan communicating with the abovementioned opening of the enclosure.

According to another feature, the or each fan comprises a means for shutting or freeing the abovementioned outlet opening of the fan according to the mode of use chosen for this ventilation device.

According to another feature, the ventilation device further comprises a grill-forming modular element that can be mounted on a mounting support, and also comprising a nose-forming part that can be mounted through one of the abovementioned openings of the enclosure so that the air penetrates through the abovementioned grill and is discharged by the ventilation device situated in the vicinity of a hot zone of the enclosure.

According to another feature, the mounting support is a DIN rail.

However, other advantages and features of the invention will become more apparent from the following detailed description referring to the attached drawings given purely by way of example, and in which.

Figure 1:
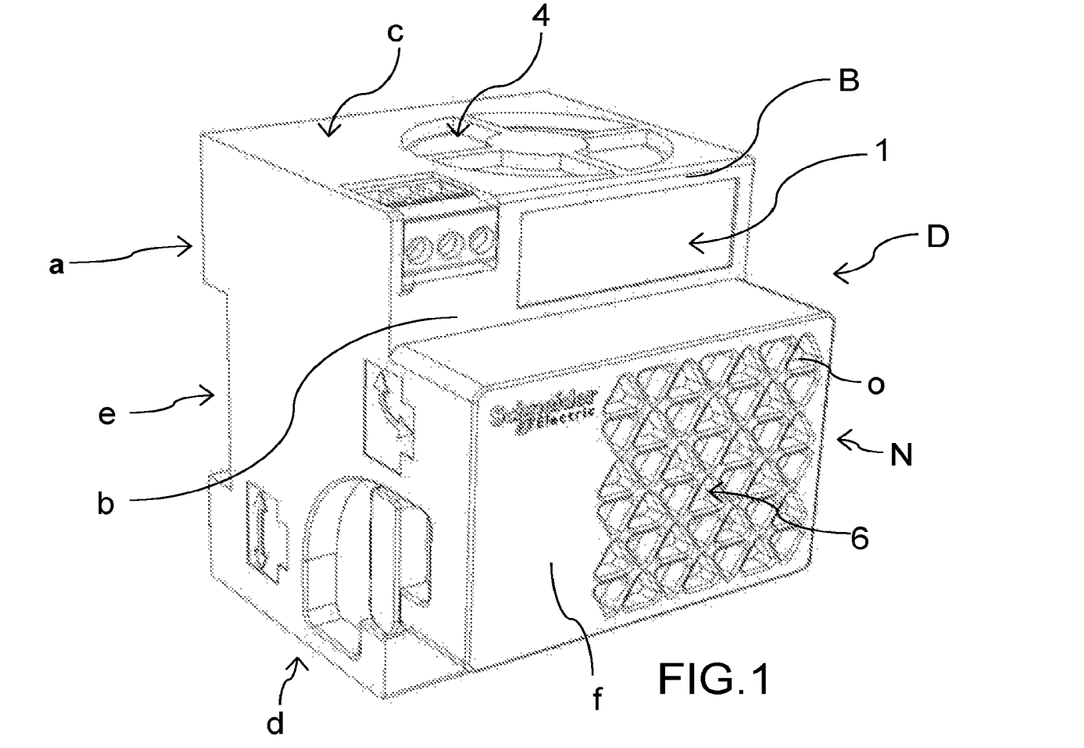
FIG. 1 is a perspective view of a ventilation device according to a particular embodiment of the invention.
Figure 2:
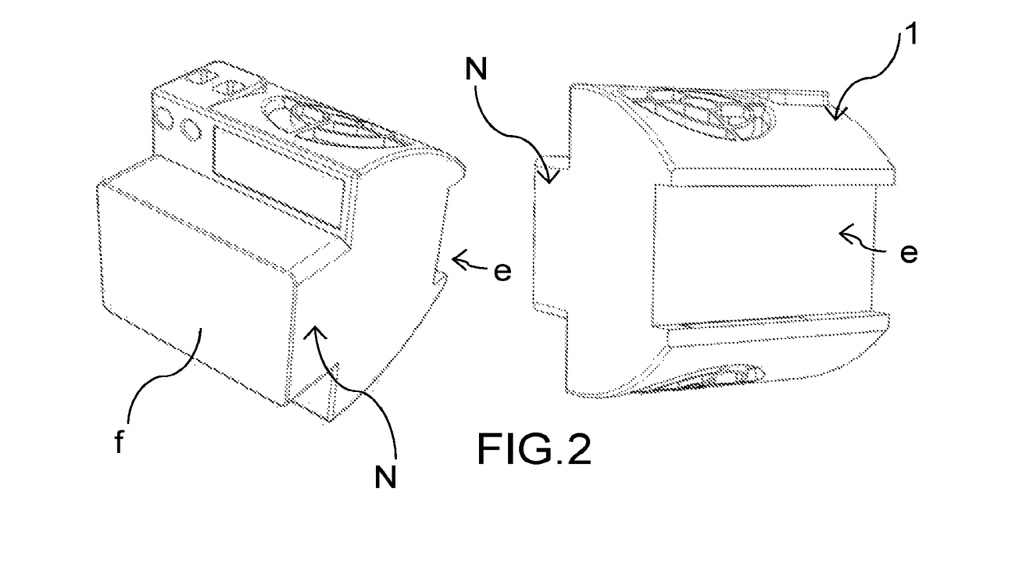
FIG. 2 is a perspective view illustrating another embodiment of this ventilation device without outlet opening to the outside, according to two different orientations.
Figure 3:
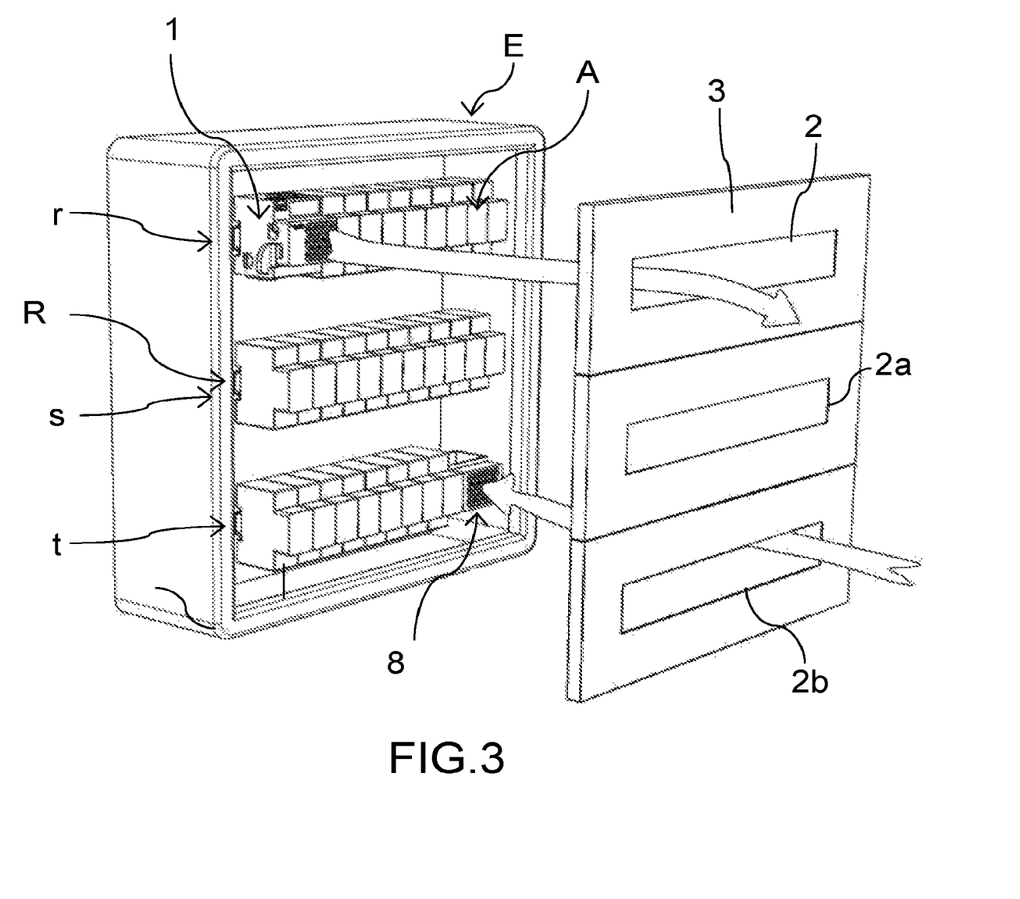
FIG. 3 illustrates, in a perspective view, the placing in an enclosure of a ventilation device in two parts, according to another embodiment of the invention.

In FIGS. 1 and 2, a ventilation device D can be seen comprising a fan 1 intended to be installed in an enclosure E or electrical cabinet according to the invention, said enclosure housing modular electrical protection units A, as illustrated in FIG. 3.

Inside this cabinet and as is known per se, these units are mounted on mounting rails R aligned with one another and attached by one of their side faces. To this end, the units comprise, on their rear face a, means for fixing to the rail R, these fixing means comprising a recess e formed in this rear face cooperating with a particular form of the rail.

According to the invention, this fan 1 takes the form of a module having an outer form substantially like the outer form of the other units, this module being able to be fixed onto the mounting rail in the same way as the other units. Thus, this fan is housed in a casing B of substantially parallelepipedal form comprising, on one a of its faces, called rear face, means for fixing to the mounting rail, and, on its front face b, a nose-forming part N.

This nose-forming part is intended to be introduced, as is the case for the other modular units of the enclosure, into an opening 2 of elongate form provided for this purpose in the door-forming wall 3 of the enclosure E. It can in fact be seen that the door of the enclosure comprises three elongate openings 2,2a,2b extending respectively facing the three rows r,s,t of modular units.

This fan comprises, on its two opposite faces, respectively top and bottom c,d, an orifice 4,5, this orifice being intended to allow air to be introduced into the unit or air to escape to the outside of the unit.

This fan also comprises, on the outer face f of the abovementioned nose N, an outlet opening 6 intended for the hot air to escape when the ventilation device is used to convey the hot air to the outside, this opening consisting of a plurality of orifices o. According to a particular embodiment of the invention illustrated more particularly in FIGS. 6 to 11, this outlet opening 6 can be shut by a shutter 7 mounted articulated relative to the casing B of the unit so as to be able to be brought by a user either into a first position in which this shutting device or shutter 7 closes the abovementioned opening 6 and therefore prevents the passage of the air through this opening, or a second position in which the abovementioned opening 6 is freed so as to allow the air to escape. Thus, the first position of the shutter allows the ventilation device to be used to produce a stirring of the air inside the enclosure, whereas the second position of the shutter allows the ventilation device to be used to produce the escape of the hot air to the outside of the enclosure.

Advantageously, this ventilation device D according to the invention comprises thermal sensors to detect an overheating inside the enclosure, and means for automatically triggering the fan following the occurrence of this overheating.

Also advantageously, and more particularly when this fan is used only for the stirring of the air inside the enclosure, this fan comprises humidity sensors, for example a heating resistor, that can measure the relative humidity inside the enclosure, and heating means that can be controlled by the humidity sensors, so as to keep the inside of the enclosure at the desired temperature.

Figure 4:
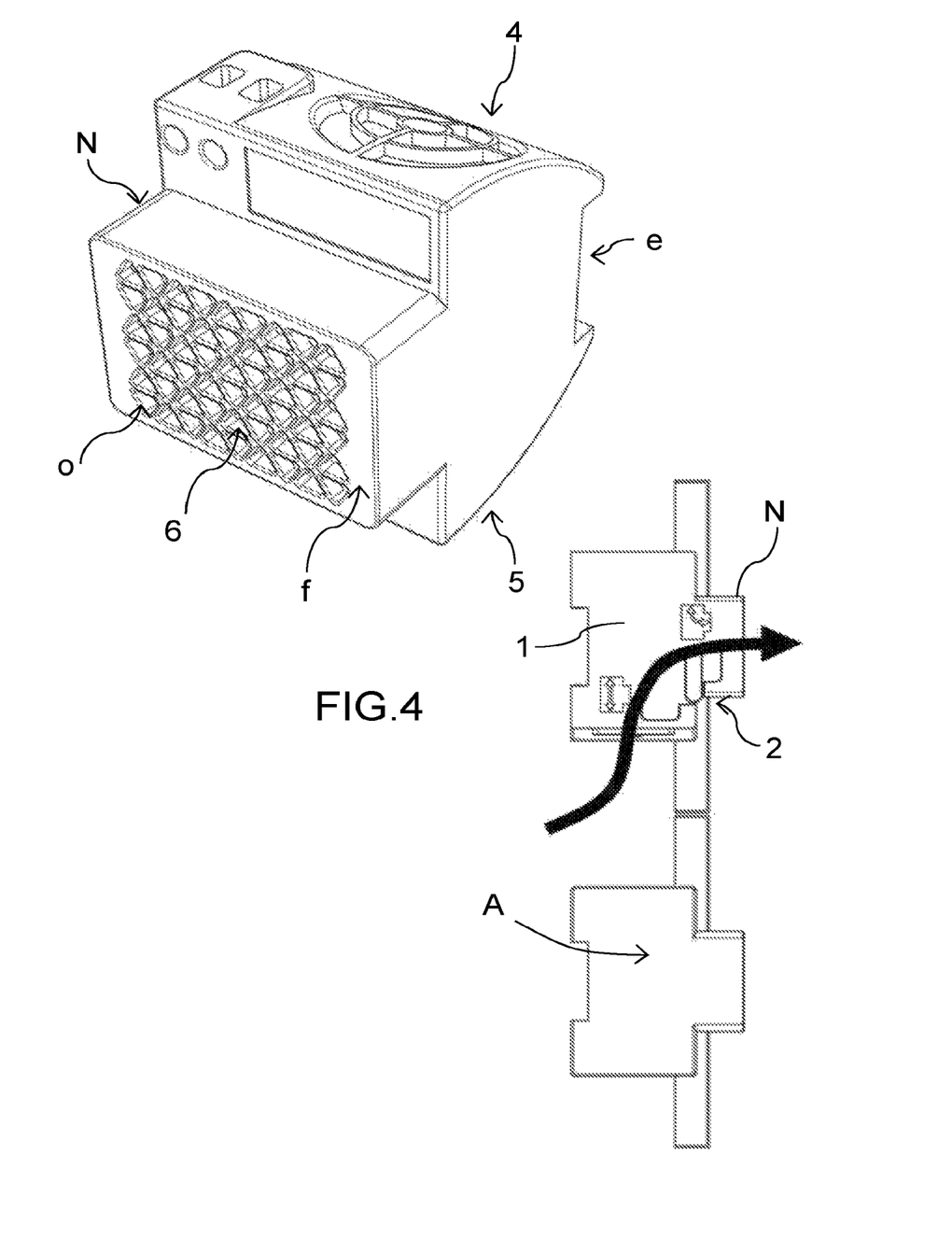
FIG. 4 is a view partially in perspective and partially in cross section respectively illustrating a fan and the interaction between the door of the enclosure and the units.
Figure 5:
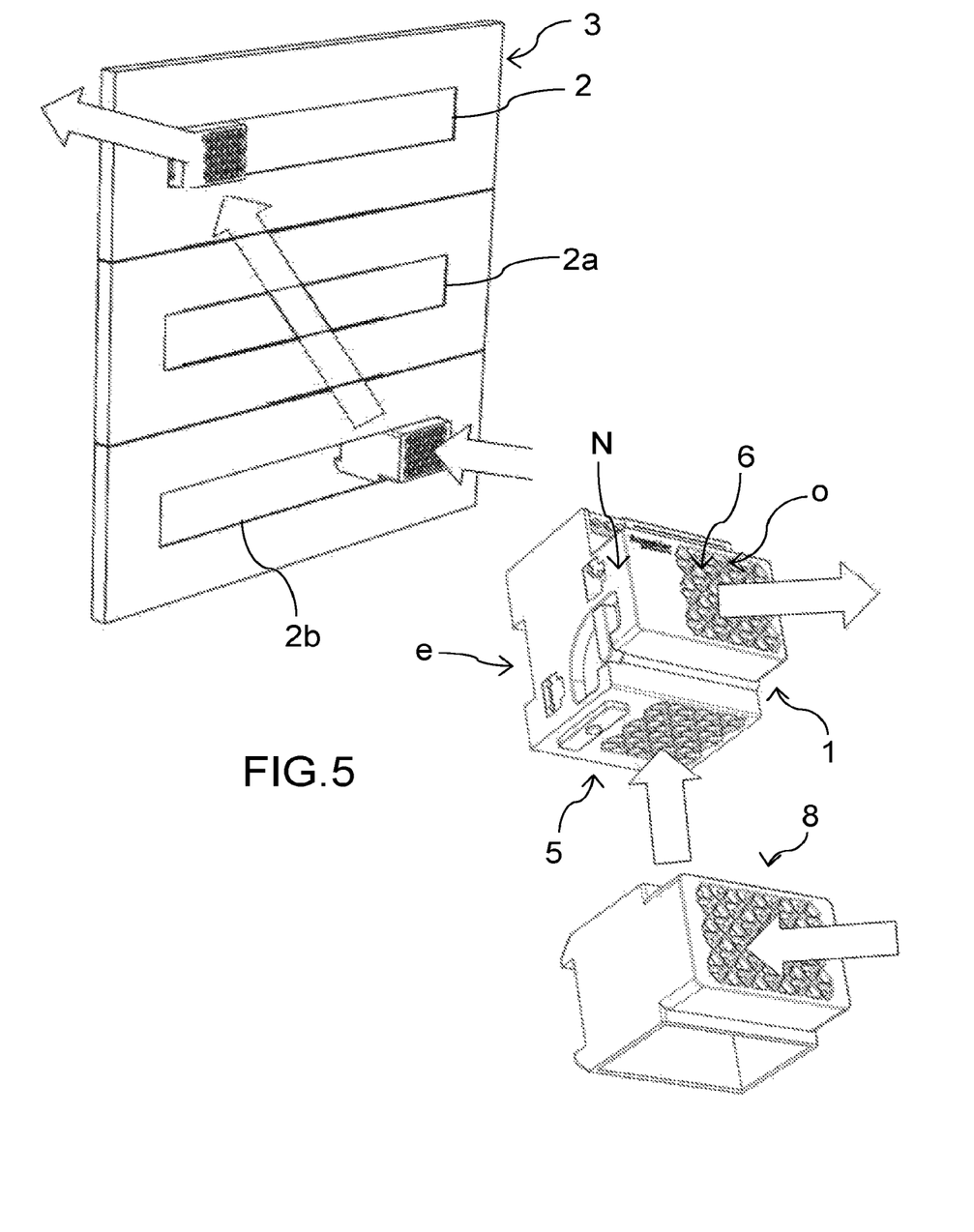
FIG. 5 is a perspective view illustrating the path of the air according to this embodiment of the invention illustrated in FIGS. 3 and 4, FIGS. 6, 7 and 8 illustrate, respectively in a perspective view, a perspective view showing the internal part of the unit and a cross-sectional view, a particular use of the ventilation device to discharge the hot air to the outside of the enclosure.

According to the embodiment illustrated in FIGS. 3 to 5, this ventilation device D comprises a fan 1 and a modular grill 8, this fan 1 being placed at the left end of the top row r of the modular units, while this grill 8 is situated at the right end of the bottom row t of modular units.

Thus, as illustrated in FIGS. 3 to 5, the ambient air enters into the enclosure E through the conventional modular grill 8 and is discharged by the fan 1 situated close to the units forming the heat sources.

Figure 6:
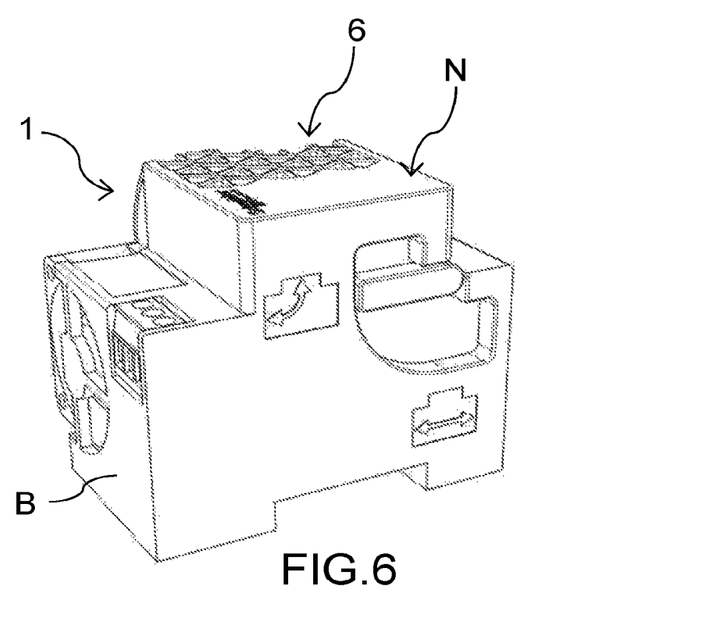
Figure 7:
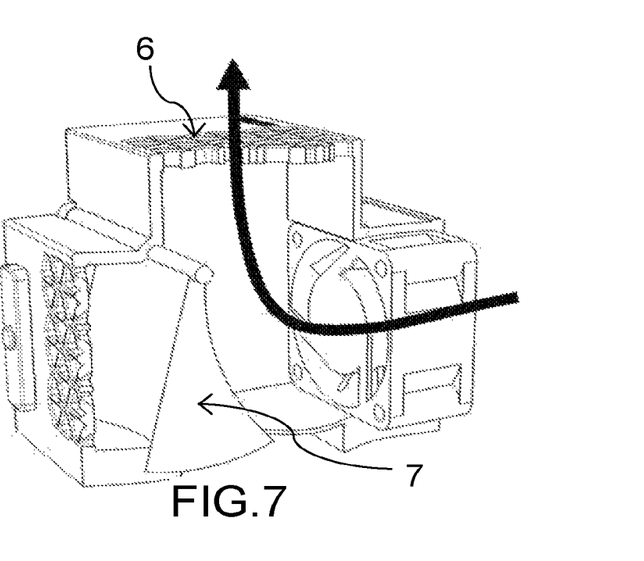
Figure 8:
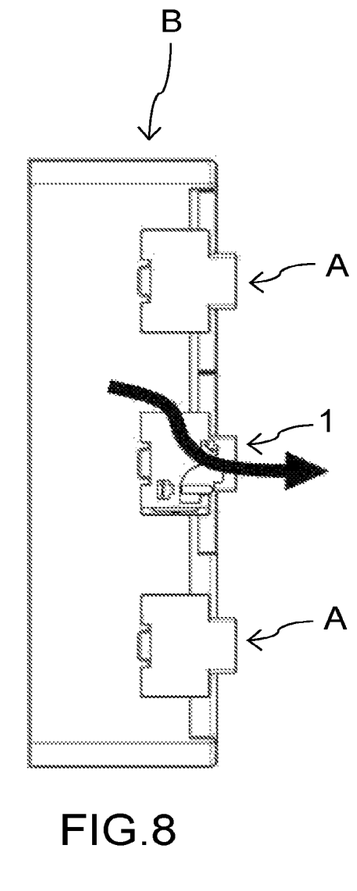

As illustrated in FIGS. 6 to 8, the ventilation device D according to the invention can be used to discharge the hot air to the outside of the enclosure E through the nose-forming part N of the fan 1. In this case, the shutter 7 is in open position.

Figure 9:
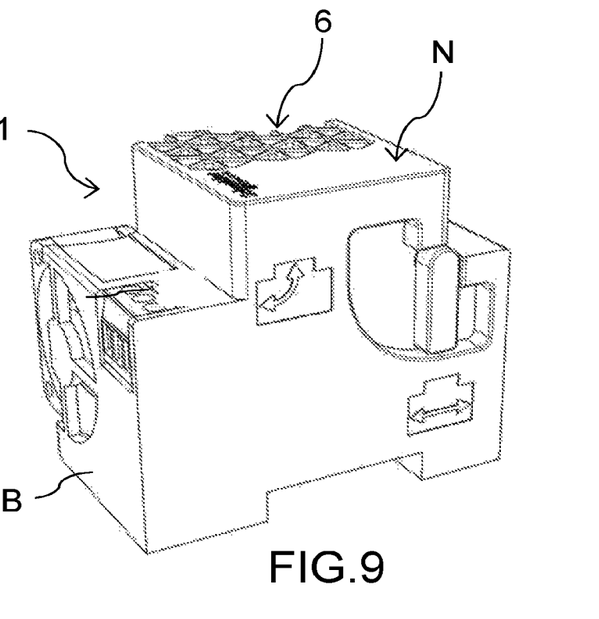
FIGS. 9, 10 and 11 are views similar to the preceding figures, but showing another particular use of the ventilation device to produce a stirring of the air.
Figure 10:
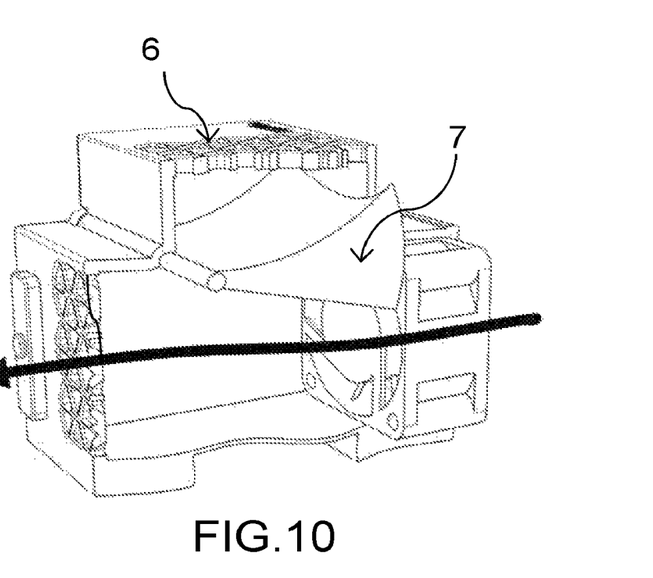
Figure 11:
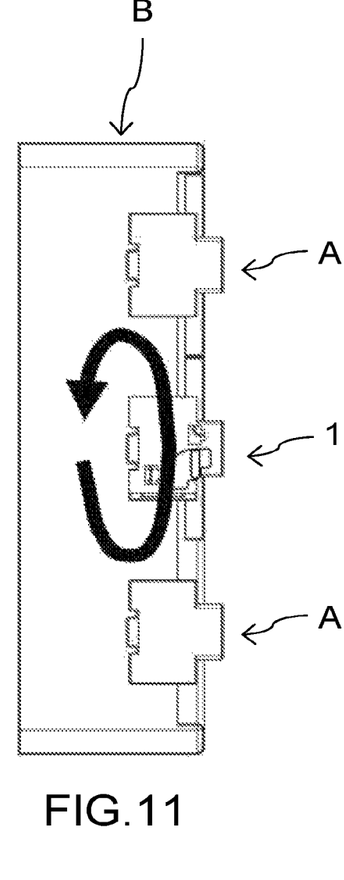

As illustrated in FIGS. 9 to 11, the device D according to the invention is used to produce a stirring of the air inside the enclosure E. In this case, the shutter 7 is in closed position for shuttering the outlet opening 6.

Thus, this fan according to the invention is positioned like any other modular unit in the enclosure and can be incorporated in all the enclosures. It is positioned as close as possible to the units which heat up and is easily wired.

It is no longer necessary to cut the enclosure, because the existing modular window is used to discharge the hot air to the outside of the enclosure.

Therefore, according to the invention, a ventilation device has been produced that is capable of being able to be installed in any type of enclosure, drawer included, in order to create a circulation of internal air (called stirring) or to discharge the hot air from the enclosure. By being able to be installed on a modular rail, this fan is totally independent of the enclosure. Its connection and that of the other modular units is thus simplified.

Obviously, the invention is not limited to the embodiments described and illustrated which have been given only by way of example.

On the contrary, the invention includes all the technical equivalents of the means described as well as their combinations provided the latter are produced in accordance with its spirit.

The invention claimed is:

1. An air ventilation device inside an enclosure configured to house modular electrical units mounted on a mounting support, said air ventilation device comprising:
   at least one fan in the form of a module that can be fixed onto said mounting support alongside the other units, the at least one fan including
   an exhaust to discharge hot air from inside the enclosure to outside of the enclosure, and
   a curved shutter configured to shut the exhaust when in a first position and configured to divert the hot air into the exhaust when in a second position, the curved shutter having a first concave side exposed to the hot air when the curved shutter is in the first position and having a second concave side exposed to the hot air when the curved shutter is in the second position, an end of the curved shutter that is connected to a pivot point being thinner than an end of the curved shutter furthest from the pivot point.

2. The ventilation device according to claim 1, wherein the at least one fan is configured to create a stirring of air inside the enclosure.

3. The ventilation device according to claim 1, wherein the curved shutter is articulated on an internal part of a casing of the at least one fan.

4. The ventilation device according to claim 1, further comprising at least one thermal sensor, and said ventilation device is automatically triggered under control of said thermal sensor.

5. The ventilation device according to claim 1, further comprising at least one humidity sensor, and a heater controlled by said humidity sensor.

6. The ventilation device according to claim 5, wherein said heater includes a heating resistor.

7. The ventilation device according to claim 1, wherein the first and second sides of the curved shutter are opposite each other and concave in a direction of air flow.

8. An enclosure configured to house modular electrical units, said modular electrical units being mounted on a mounting support, said enclosure comprising one ventilation device according to claim 1.

9. The enclosure according to claim 8, wherein said ventilation device is attached to one of the faces of a modular unit belonging to a row of units mounted on one and the same mounting support.

10. The enclosure according to claim 8, wherein said enclosure comprises, facing one or each mounting support intended to receive a row of units, an elongate opening intended to allow the passage of a nose-forming part of the units, said part comprising a manual operating lever of the units, wherein said ventilation device has substantially the same outer form as a modular electrical unit, and also comprises a nose-forming part that can pass through said opening of the enclosure so as to allow the discharging of the hot air through said opening of the enclosure via an outlet opening of the fan communicating with said opening of the enclosure.

11. The enclosure according to claim 8, wherein the ventilation device further comprises a grill-forming modular element that can be mounted on a mounting support, and also comprising a nose-forming part that can be mounted through one of said openings of the enclosure so that the air penetrates through said grill and is discharged by the ventilation device situated in a vicinity of a hot zone of the enclosure.

12. The enclosure according to claim 8, wherein the mounting support is a DIN rail.

* * * * *